United States Patent [19]
Whitman et al.

[11] Patent Number: 5,968,710
[45] Date of Patent: Oct. 19, 1999

[54] CONTROLLED REMOVAL OF ELECTRON BEAM CURABLE COATINGS AND ARTICLES FORMED THEREBY

[75] Inventors: John Whitman; Jeff Johnson, both of Boise, Id.

[73] Assignee: Micron Technology, Inc., Boise, Id.

[21] Appl. No.: 09/026,542

[22] Filed: Feb. 19, 1998

[51] Int. Cl.$^6$ ....................................................... G03C 5/00
[52] U.S. Cl. .............................................. 430/296; 216/38
[58] Field of Search ................................ 430/296; 216/38

[56] References Cited

U.S. PATENT DOCUMENTS

| | | | |
|---|---|---|---|
| 4,227,090 | 10/1980 | Amboss | 250/492 |
| 4,576,884 | 3/1986 | Reisman | 430/30 |
| 5,003,178 | 3/1991 | Livesay | 250/492.3 |
| 5,346,585 | 9/1994 | Doan et al. | 156/643 |
| 5,545,512 | 8/1996 | Nakato | 430/323 |

OTHER PUBLICATIONS

Matthew F. Ross, David Comfort and George Gorin, "*Plasma Etch Characteristics of Electron Beam Processed Photoresist,*" a paper presented at SPIE Microlithography 1995 Conference.

W.R. Liveway, "*Vertical Lithography–controlling Resist Profiles in Optical Lithography with a Large Area Electron Beam,*" a paper presented at SPIE Microlithography 1994 Conference.

W.R. Liveway, A.L. Rubiales, M. ross, S. Woods and S. Campbell, "*Electron Beam Hardening of Photoresist,*" a paper presented at SPIE Microlithography 1993 Conference.

Electron Vision Technical Bulletin, Jun. 16, 1994 entitled "*Electron Beam Processing of Allied Signal Accuglass 211 SOG.*"

Electron Vision Bulletin on "*ElectronCure X™ Series.*"

Electron Vision Bulletin entitled, "*Comparison Analysis UV Skin Bake vs. ElectronCure™ System.*" 1992.

Electron Vision Technical Bulletin entitled "*Electron Beam Processing of High Temperature Interlayer Dielectric,*" Jun. 16, 1994.

Electron Vision Technical Bulletin entitled "*Air Bride Fabrication Using the ElectronCure™ System,*" Jun. 16, 1994.

Electron Vision Press Release entitled "*Kodak Gets the ElectronCure ™ Picture for Thin Film Heads,*" Mar. 6, 1995.

*Primary Examiner*—Christopher G. Young
*Attorney, Agent, or Firm*—Killworth, Gottman, Hagan & Schaeff, LLP

[57] ABSTRACT

The present invention provides for the controlled rate of removal of common electron beam-curable materials, such as photoresists, from substrates, including silicon wafers in various stages of fabrication, by typical CMP processes and also provides a method of planing or otherwise altering the surface topography of a these substrates. The present invention utilizes typical CMP processes and common electron beam-curable materials to protect the underlying substrate surface from scratching and polishing away during the CMP processing. In addition, because of the ability in the present invention to precisely tailor the etch rates of the electron beam-curable material with that of the underlying substrate, substrates may be formed which have areas of electron beam-curable material which is either convex or concave to the plane of the substrate surface.

30 Claims, 6 Drawing Sheets

CONTROLLED REMOVAL OF ELECTRON BEAM CURABLE COATINGS AND ARTICLES FORMED THEREBY

FIELD OF THE INVENTION

The present invention relates to methods of removing certain coatings, and in particular, the present invention relates to methods of removing electron-beam curable materials and to articles formed thereby.

BACKGROUND OF THE INVENTION

During the fabrication of silicon wafers used in the manufacture of semiconductor devices and circuits, as the various layers are etched into patterns, the surface of the wafer becomes one of high and low plateaus with the plateaus being delineated by steps. The deposition of certain materials (e.g., oxides, nitrides, metals, polysilicon) over these steps results in an uneven surface topography due to their tendency to conform to the topography over which they are deposited (i.e., conformal materials). However, a flat surface is normally required to allow accurate further fabrication. Therefore, this uneven surface must be planed before further fabrication steps can take place.

Although there are various planarization methods known, the only process that provides global planarization of an entire wafer is chemical-mechanical polishing (CMP) which is a combination of chemical etching and mechanical buffing. CMP processes render an uneven surface topography planar by typically removing between 500 and 20,000 Å from the surface of the fabricated wafer. However, the CMP process must be accomplished without contaminating or scratching the surface of the fabricated wafer and without polishing away portions of materials already laid down.

One solution to the problem of planarization is to apply a material over the surface of the fabricated wafer to serve as an etch mask to protect the underlying layers during CMP processing. Etch mask materials exhibit low viscosity and are applied to the fabricated wafer by a spinning technique. This combination of low viscosity and application by spinning results in the etch mask material filling in the gaps and voids created by the steps and thereby forming a planar surface. After any necessary curing or other treatment of the etch mask material, the wafer is then subjected to CMP processing. The CMP processing of a fabricated wafer which has been coated with an etch mask material can be envisioned as occurring in two distinct stages. The first stage is the removal of the etch mask material down to the top of the highest peaks of the last layer to be applied to the fabricated wafer (e.g., a conformal layer). The second stage is the simultaneous removal of portions of these peaks and portions of etch mask material. If the etch mask material etches at a uniform rate throughout its thickness, the resulting surface after the first stage of CMP processing is planar. And if the etch mask material etches at substantially the same rate as that of the last layer to be deposited on the wafer, the resulting surface after the second stage of CMP processing will also be planar and therefore suitable for further fabrication. However, if the etch mask material does not etch at a uniform rate throughout its thickness and/or if the etch mask material does not etch at substantially the same rate as that of the last layer to be deposited on the wafer, then the resulting surface after the second stage of CMP processing will not be planar. Therefore, in order to render an uneven surface of a substrate planar with CMP processing, it is necessary 1) that the etch mask material etch uniformly throughout its thickness and 2) that the etch mask material etch at substantially the same rate as that of the last layer to be applied to the fabricated wafer.

These two criteria are difficult to obtain using conventional etch masking materials and CMP processes and prior to the present invention, achieving these criteria required the use of exotic etch masking materials and/or uncommon CMP processes. Typical etch masking materials etch at uncontrollable rates. For example, typical photoresists, if uncured, can etch at uncontrollable rates of approximately 1000 Å per second, thereby making it essentially impossible to achieve the control necessary to render the surface planar.

Curing the etch mask material prior to CMP processing will slow the etch rate of the material. However, most common methods of curing do not result in uniform curing throughout the thickness of the etch mask material and therefore result in nonuniform etch rates. This is because the chemical and mechanical property limits of the etch mask material are often exceeded before sufficient curing is achieved. However, it is known that electron beam radiation can be distributed uniformly throughout certain materials which are suitable for use as etch mask materials. This uniformity insures that the etch rate is uniform throughout the film thickness. In addition, electron beam radiation is known to stabilize photoresists, which may also be used as etch mask materials, thereby rendering them resistant to plasma etching during patterning processes on a silicon wafer. Stabilization of photoresists during patterning by electron beam radiation is used in order to maintain critical dimensions already on the wafer during the patterning process. Matthew F. Ross, David Comfort and George Gorin, "Plasma Etch Characteristics of Electron Beam Processed Photoresist", paper presented at SPIE Microlithography 1995 Conference, W. R. Livesay, "Vertical Lithography-controlling resist profiles in optical lithography with a large area electron beam", paper presented at the SPIE Microlithography 1994 Conference; W. R. Livesay, A. L. Rubiales, M. Ross, S. Woods, S. Campbell, "Electron beam hardening of photoresist", paper presented at SPIE Microlithography 1993 Conference. In addition, it is known that when certain Spin-On Glass materials (SOG), which are also suitable for use as etch mask materials, are treated with electron beam radiation, there is a decrease in etch rate which corresponds to an increase in electron beam dose. Electron Vision Technical Bulletin, Jun. 16, 1994 entitled "Electron Beam Processing of AlliedSignal Accuglass 211 SOG". However, prior to the present invention, electron beam radiation has not been used to control or tailor the etch rate of etch mask materials in order to plane the surface of as silicon wafer.

Therefore, there remains a need for a method of rendering an uneven surface topography of a fabricated wafer planar which 1) does not result in the scratching or contamination of the surface of a fabricated wafer; 2) does not polish away portions of materials already laid down; and 3) which utilizes typical etch masking materials and CMP processes.

SUMMARY OF THE INVENTION

That need is met by the present invention. Thus, in one embodiment of the present invention, there is provided a method of removing an electron beam-treated material from a substrate which comprises subjecting an electron beam-curable material to a controlled dose of electron beam radiation and then removing at least a portion of the electron beam-treated material by means of chemical-mechanical polishing, where the dose of electron beam radiation is selected such that the electron beam-treated material is removed by the chemical-mechanical polishing at a controlled rate.

In another embodiment of the present invention, there is provided a method of removing an electron beam-treated photoresist from a silicon wafer which comprises subjecting the photoresist to a controlled dose of electron beam radiation and then removing at least a portion of the electron beam-treated photoresist by means of chemical-mechanical polishing, where the dose of electron beam radiation is selected such that the electron beam-treated photoresist is removed by the chemical-mechanical polishing at a controlled rate.

In still another embodiment of the present invention, there is provided a method of planing the surface of a substrate which comprises applying an electron beam curable material to the surface of the substrate, subjecting the material to a controlled dose of electron beam radiation; and then removing at least a portion of the electron beam-treated material and those portions of the substrate surface as is required to plane the surface of the substrate, where the removal is by means of chemical-mechanical polishing and the dose of electron beam radiation is selected such that the electron beam-treated material is removed by the chemical-mechanical polishing at substantially the same rate as the rate of removal of the substrate by the chemical-mechanical polishing.

In yet another embodiment of the present invention, there is provided a method of planing the surface of a silicon wafer which comprises applying an electron beam-curable material to the surface of the silicon wafer, subjecting the material to a controlled dose of electron beam radiation, and then removing at least a portion of the electron beam-treated material and those portions of the silicon wafer surface as is required to plane the surface of the silicon wafer, where the removal is by means of chemical-mechanical polishing and the dose of electron beam radiation is selected such that the electron beam-treated material is removed by the chemical-mechanical polishing at substantially the same rate as the rate of removal of the silicon wafer surface by the chemical-mechanical polishing.

In yet still another embodiment of the present invention, there is provided a method of planing the surface of a silicon wafer which comprises applying a photoresist to the surface of the silicon wafer, subjecting the photoresist to a controlled dose of electron beam radiation, and then removing at least a portion of the electron beam-treated photoresist and those portions of the silicon wafer surface as is required to plane the surface of the silicon wafer, where the removal is by means of chemical-mechanical polishing and the dose of electron beam radiation is selected such that the electron beam-treated photoresist is removed by the chemical-mechanical polishing at substantially the same rate as the rate of removal of the silicon wafer surface by the chemical-mechanical polishing.

In still another embodiment of the present invention, there is provided a method of planing the surface of a silicon wafer which comprises applying a m-cresol Novolak formaldehyde to the surface of the silicon wafer, subjecting the m-cresol Novolak formaldehyde to a controlled dose of electron beam radiation, and then removing at least a portion of the electron beam-treated m-cresol Novolak formaldehyde and those portions of the silicon wafer surface as is required to plane the surface of the silicon wafer, where the removal is by means of chemical-mechanical polishing and the dose of electron beam radiation is selected such that the electron beam-treated m-cresol Novolak formaldehyde is removed by the chemical-mechanical polishing at substantially the same rate as the rate of removal of the silicon wafer surface by the chemical-mechanical polishing.

In yet still another embodiment of the present invention, there is provided a method of forming a planar surface on a silicon wafer, but having regions of electron beam-treated material which are concave with respect to the plane of the silicon wafer surface which comprises applying an electron beam-curable material to the surface of the silicon wafer, subjecting the material to a controlled dose of electron beam radiation, and then removing at least a portion of the electron beam-treated material and those portions of the silicon wafer surface as are required to form a planar surface on the silicon wafer having regions of electron beam-treated material which are concave with respect to the plane of the silicon wafer thereon, where the removal is by means of chemical-mechanical polishing and the dose of electron beam radiation is selected such that the electron beam-treated material is removed by the chernical-mechanical polishing at a faster rate than the rate of removal of the silicon wafer surface by the chemical-mechanical polishing.

In another embodiment of the present invention, there is provided a method of forming a planar surface on a silicon wafer, but having regions of an electron beam-treated material which are convex with respect to the plane of the silicon wafer surface which comprises applying an electron beam-curable material to the surface of the silicon wafer, subjecting the material to a controlled dose of electron beam radiation, and then removing at least a portion of the electron beam-treated material and those portions of the silicon wafer surface as are required to form a planar surface on the silicon wafer, but having regions of electron beam-treated material which are convex with respect to the plane of the silicon wafer surface, where the removal is by means of chemical-mechanical polishing and the dose of electron beam radiation is selected such that the electron beam-treated material is removed by the chemical-mechanical polishing at a slower rate than the rate of removal of the silicon wafer surface by the chemical-mechanical polishing.

In still another embodiment of the present invention, there is provided a method of planing the surface of a silicon wafer which comprises applying a m-cresol Novolak formaldehyde to the surface of the silicon wafer, subjecting the m-cresol Novolak formaldehyde to a controlled dose of electron beam radiation, and then removing at least a portion of the electron beam-treated m-cresol Novolak formaldehyde and those portions of the silicon wafer surface as is required to plane the surface of the silicon wafer, where the removal is by means of wet chemical mechanical polishing and the dose of electron beam radiation is selected such that the electron beam-treated m-cresol Novolak formaldehyde is removed by the wet chemical mechanical polishing at substantially the same rate as the rate of removal of the silicon wafer surface by the chemical-mechanical polishing.

In still another embodiment of the present invention, there is provided a method of planing the surface of a silicon wafer which comprises applying a m-cresol Novolak formaldehyde to the surface of the silicon wafer, subjecting the m-cresol Novolak formaldehyde to a controlled dose of electron beam radiation, and then removing at least a portion of the electron beam-treated m-cresol Novolak formaldehyde and those portions of the silicon wafer surface as is required to plane the surface of the silicon wafer, where the removal is by means of wet chemical mechanical polishing and the dose of electron beam radiation is selected such that the electron beam-treated m-cresol Novolak formaldehyde is removed by the dry chemical mechanical planarization processing at substantially the same rate as the rate of removal of the silicon wafer surface by the chemical-mechanical polishing.

In another embodiment of the present invention, there is provided a silicon wafer having a planar surface, but having regions of electron beam-treated material which are concave with respect to the plane of the silicon wafer surface prepared by applying an electron beam-curable material to the surface of a silicon wafer, subjecting the material to a controlled dose of electron beam radiation, and then removing at least a portion of the electron beam-treated material and those portions of the silicon wafer surface as are required to form a planar surface on the silicon wafer having regions of electron beam-treated material which are concave with respect to the plane of the silicon wafer thereon, where the removal is by means of chemical-mechanical polishing and the dose of electron beam radiation is selected such that the electron beam-treated material is removed by the chemical-mechanical polishing at a faster rate than the rate of removal of the silicon wafer surface by the chemical-mechanical polishing.

In yet another embodiment of the present invention, there is provided a silicon wafer having a planar surface, but having regions of electron beam-treated material which are convex with respect to the plane of the silicon wafer surface prepared by applying an electron beam-curable material to the surface of a silicon wafer, subjecting the material to a controlled dose of electron beam radiation, and then removing at least a portion of the electron beam-treated material and those portions of the silicon wafer surface as are required to form a planar surface on the silicon wafer having regions of electron beam-treated material which are convex with respect to the plane of the silicon wafer thereon, where the removal is by means of chemical-mechanical polishing and the dose of electron beam radiation is selected such that the electron beam-treated material is removed by the chemical-mechanical polishing at a slower rate than the rate of removal of the silicon wafer surface by the chemical-mechanical polishing.

DETAILED DESCRIPTION OF THE INVENTION

Figure 1:
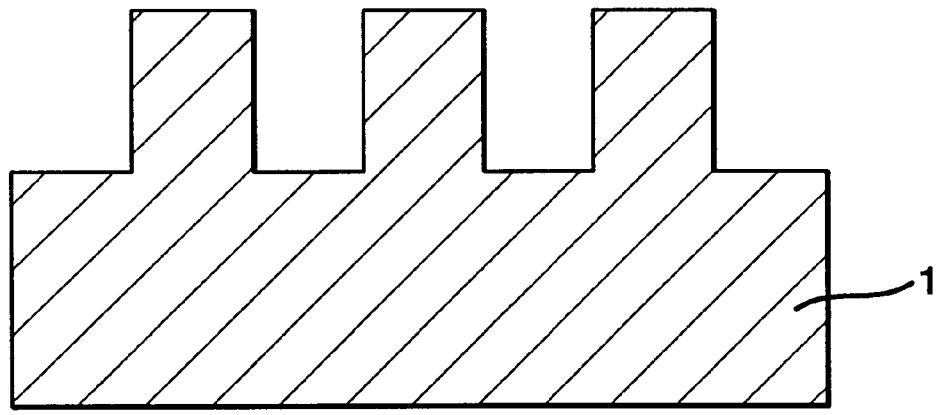
FIG. 1 is a cross-section of a substrate with an uneven surface.
Figure 2:
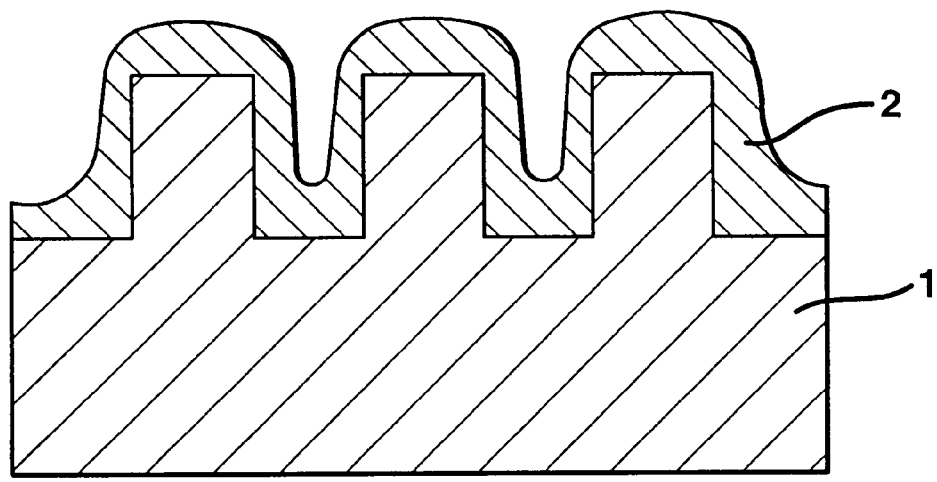
FIG. 2 is a cross-section of a substrate with an uneven surface overlayed with a conformal material.
Figure 3:
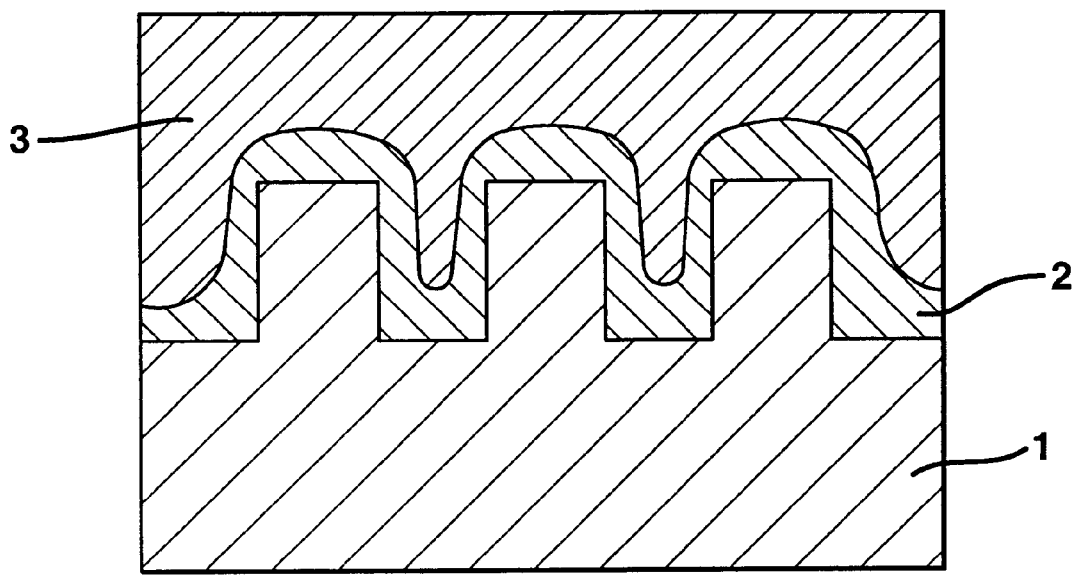
FIG. 3 is a cross-section of a substrate with an uneven surface overlayed first with a conformal material and second with an electron beam-curable material.
Figure 4:
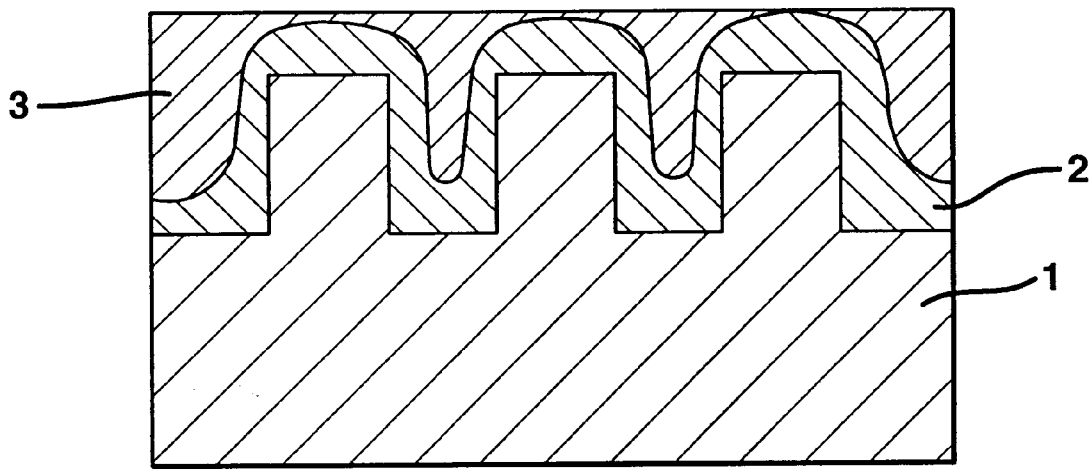
FIG. 4 is a cross-section of a substrate with an uneven surface overlayed first with a conformal material and second with an electron beam-curable material after removal of the electron beam-curable material from the surface of the electron beam-curable material down to the top of the highest peaks of the conformal material.
Figure 5:
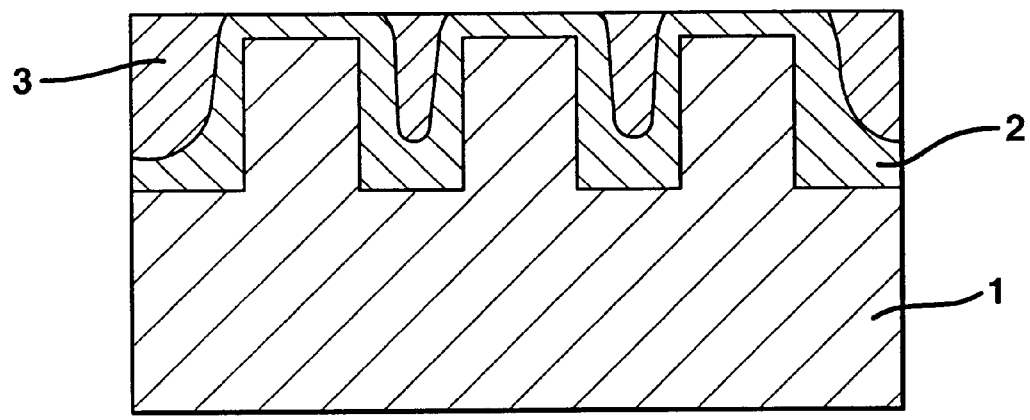
FIG. 5 is a cross-section of a substrate with an uneven surface overlayed first with a conformal material and second with an electron beam-curable material after removal of the electron beam-curable material wherein the rate of removal of the electron beam-curable material is substantially the same as the rate of removal of the conformal layer, showing a planar surface.
Figure 6:
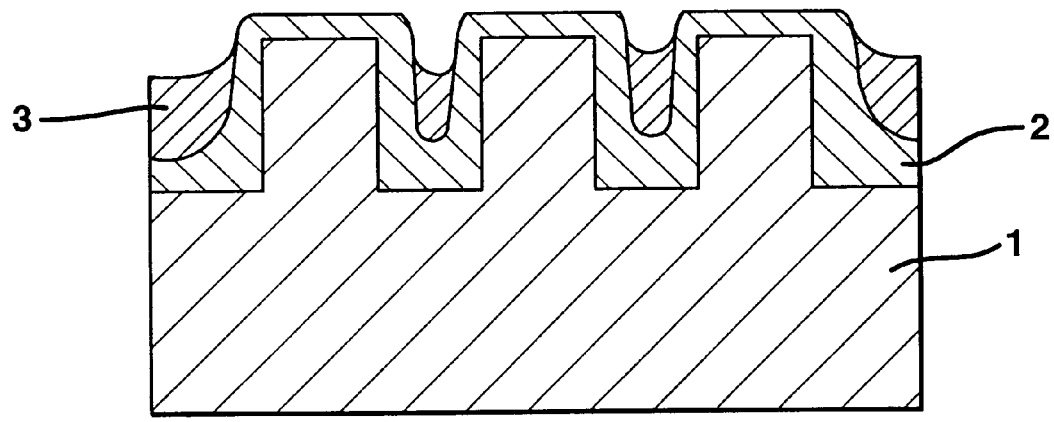
FIG. 6 is a cross-section of a substrate with an uneven surface overlayed first with a conformal material and second with an electron beam-curable material after removal of the electron beam-curable material wherein the rate of removal of the electron beam-curable material is faster than the rate of removal of the conformal layer, showing concave regions of electron beam-curable material.
Figure 7:
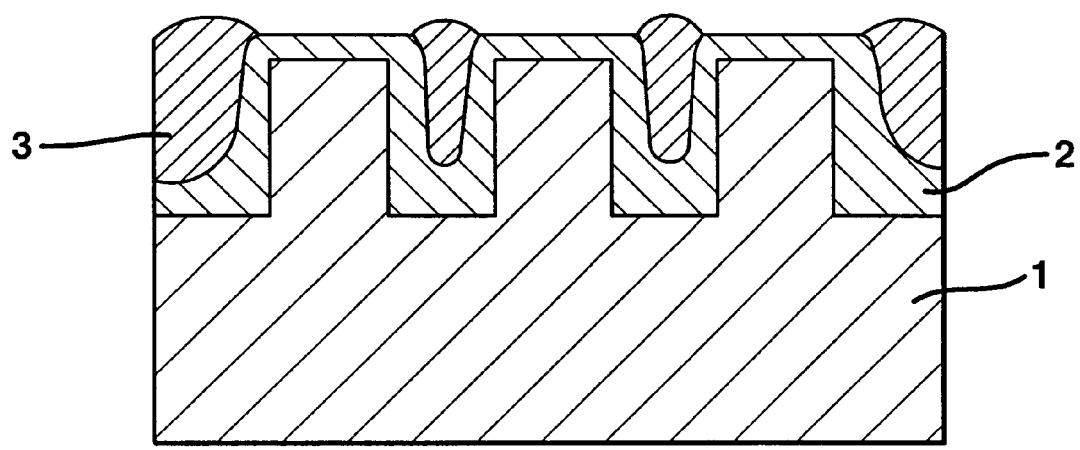
FIG. 7 is a cross-section of a substrate with an uneven surface overlayed first with a conformal material and second with an electron beam-curable material after removal of the electron beam-curable material wherein the rate of removal of the electron beam-curable material is slower than the rate of removal of the conformal layer, showing convex regions of electron beam-curable material.

The present invention provides generally for the controlled rate of removal of common electron beam-curable materials, such as photoresists, from substrates using typical CMP processes. The rate of removal of these materials is controlled by controlling the extent to which they are cured. This degree of control over the extent of curing is possible because, with electron beam curing, a linear or near-linear relationship exists (over certain ranges of electron beam radiation doses) between the dose of electron beam radiation used and the subsequent rate of removal of the material by CMP processes. This relationship allows one to select the particular dose of electron beam radiation required to achieve a specific decree of cure and therefore, a specific rate of removal of a given electron beam-curable material.

In the case of a substrate surface of uneven topography, such as a fabricated silicon wafer, the present invention also allows one to control the resulting topography of the substrate surface after CMP processing. For example, deposition of an electron beam-curable material, such as a photoresist, over an uneven substrate surface and treatment with a dose of electron beam radiation (within the range of doses which exhibit a linear or near-linear relationship) which will result in the rate of removal of the electron beam-curable material being substantially the same as the etch rate of the particular substrate material underlying the etch mask material results in a planar substrate surface topography after CMP processing. Deposition of an electron beam-curable material over the substrate surface and treatment which will result in a rate of removal of the electron beam-curable material which is faster than the etch rate of the particular substrate material results in a substrate surface topography which has regions of electron beam-curable material which are concave to the plane of the substrate surface, but which is otherwise planar after CMP processing. Similarly, deposition of an electron beam-curable material over the substrate surface and treatment with a dose of electron beam radiation which will result in a rate of removal of the electron beam-curable material which is slower than the etch rate of the particular substrate material results in a substrate surface topography which has regions of electron beam-curable material which are convex to the plane of the substrate surface, but which is otherwise planar after CMP processing. As used herein, the term "substantially the same as" refers to a ratio of etch rates of the electron beam-curable material to the substrate material which is about 0.75–1.25:0.75–1.25. The term "faster" refers to a ratio of etch rates of the electron beam-curable material to the substrate material which is greater than the ratio of about 1.25:0.75 while the term "slower" refers to a ratio of etch rates of the electron beam-curable material to the substrate material which is less than the ratio of about 0.75:1.25.

Therefore, the present invention not only provides for the controlled rate of removal of common electron beam-curable materials, such as photoresists, from substrates by typical CMP processes, but also provides a method of planing or otherwise altering the surface topography of a substrate. The present invention utilizes typical CMP processes and common electron beam-curable materials to protect the underlying substrate surface from scratching and polishing away during the CMP processing. In addition, because of the ability in the present invention to precisely tailor the etch rates of the electron beam-curable material with that of the underlying substrate, substrates may be formed which have areas of electron beam-curable material which are either convex or concave to the plane of the surface substrate.

Thus, there is provided a method for planing or otherwise altering the surface topography of s substrate which generally comprises applying an electron beam-curable material to the surface of a substrate; subjecting the material to a controlled dose of electron beam radiation, and then removing at least a portion of the electron-beam-treated material (and in some instances, a portion of the substrate surface) from a substrate using typical CMP processes.

According to the present invention, the term "substrate" means any material with sufficient load bearing capability and internal strength to withstand the application of a layer of an etch mask material. Included within this definition are metals, ceramics, plastics, glass, quartz, and the like. Also included within this definition are silicon structures, including silicon wafers; silicon structures in the process of fabrication, including silicon wafers in the process of fabrication; a semiconductor layer, including a semiconductor layer in the process of fabrication; and the like. "Silicon wafer" means either the lowest layer of a semiconductor material in a wafer or a wafer having additional layers or structures formed thereon. The term "fabrication" means the process of forming patterns on a silicon structure or semiconductor structure through photolithography.

As used herein, the term "substrate surface" or "surface of the substrate" refers to the outermost portion of the substrate. Specifically, the term "silicon wafer surface" refers to the surface on a silicon wafer and includes the surface of a silicon wafer at any stage of fabrication. Therefore "silicon wafer surface" includes surfaces composed of semiconductor materials, conductive materials, dielectric materials, and the like and includes silicon, silicon dioxide, silicon nitride, epitaxial silicon, polysilicon, silicon monoxide, metal, metal alloy, photoresists, resins, polyimides, spin-on glass, and the like.

The term "electron beam-curable material" means any material capable of being chemically modified (i.e., polymerized, cross-linked, or degraded) by exposure to electron-beam radiation. Examples of such materials are photoresists, spin-on-glass, polyimides, resins. Examples of typical photoresists are m-cresol Novolak formaldehyde, poly isoprene, poly-(methyl methacrylate), poly-(methyl isopropenyl ketone), poly-(butene-1-sulfone), poly-(trifluoroethyl chloroacrylate), copolymer-($\alpha$ cyano), ethyl acrylate-$\alpha$-amido ethyl acrylate, poly-(2-methyl pentene-1-sulfone), SPR-950, available from Shipley, 897-10i and OIR-620, available from Olin, and PFI-66A7, available from Sumitomo, 66a, available from Surnitoma, 38a, available from Sumitoma, 405, available from JSR, HiPR-6517, available from Hoechst Celanese. Examples of spin-on-glass are Acuglass 211 SOG, available from Electron Vision. Examples of resins are FSC-L, available from Shipley.

The electron-beam curable material is applied to the substrate surface by techniques well known in the art, such as spinning techniques, to a thickness of from about 1000 Å to about 40,000 Å. As one of ordinary skill in the art would realize, the particular thickness is dependent upon the particular electron-beam curable material used, the technique used to coat the electron-beam curable material onto the substrate, and the particular CMP process to be utilized. For example, photoresist 897-10i is spin coated onto a substrate at a thickness of from about 10,000 Å –14,000 Å with a range of 11,000 Å–12,000 Å being preferred, and a range of 11,500–12,700 Å being particularly preferred. Photoresist OIR-620 is spin coated onto a substrate at a thickness of from about 9,000 Å–12,000 Å, with a range of 10,000 Å–11,000 Å being preferred, and with about 10,800 Å being particularly preferred. Photoresist 38a is spin-coated onto a substrate at a thickness of from about 10,000 Å–12,500 Å, with a range of about 11,000–12,000 Å being preferred, and with about 11,600 Å being particularly preferred. Photoresist 66a is spin coated onto a substrate at a thickness of from about 7000 Å–11,000 Å, with a range of 8000 Å–10,000 Å being preferred, and with about 9500 Å being particularly preferred. And photoresist 405 is spin-coated onto a substrate at a thickness of from about 25,000 Å–40,000 Å, with a range of about 30,000 Å–35,000 Å being preferred, and with about 33,000 Å being particularly preferred.

After the electron beam-curable material is applied to the substrate, the coated substrate is heated briefly at a temperature of from about 75° C.–150° C., at a period of time ranging from about 20 seconds to 5 minutes. As one of ordinary skill in the art would realize, the particular temperature and time of the bake is dependent upon which electron-beam curable material is utilized.

Figure 8:
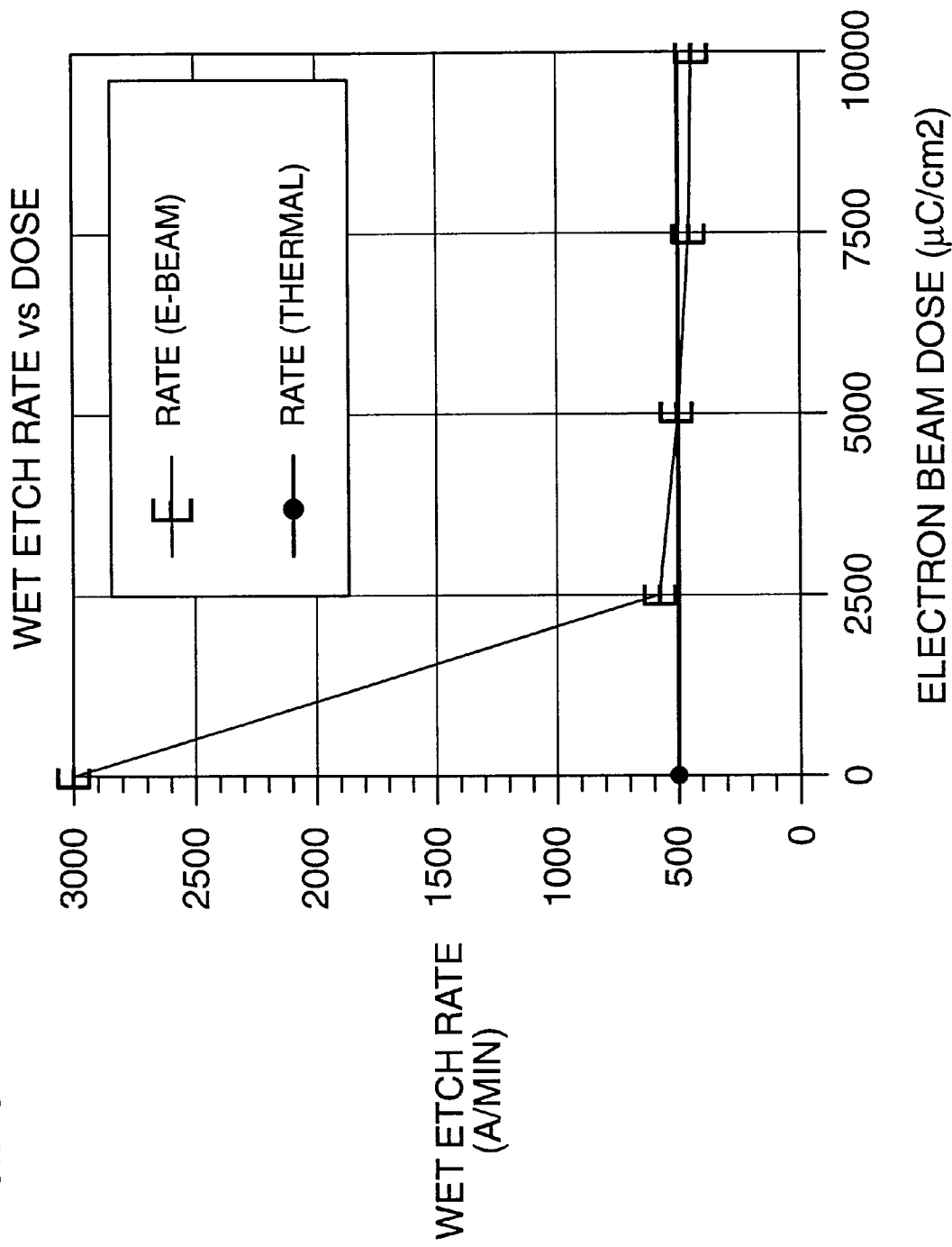
FIG. 8 is a graph of the wet etch rate of AlliedSignal's Accuglass 211 SOG, in Å/min. vs. dose of electron beam radiation in $\mu C/cm^2$.
Figure 9:
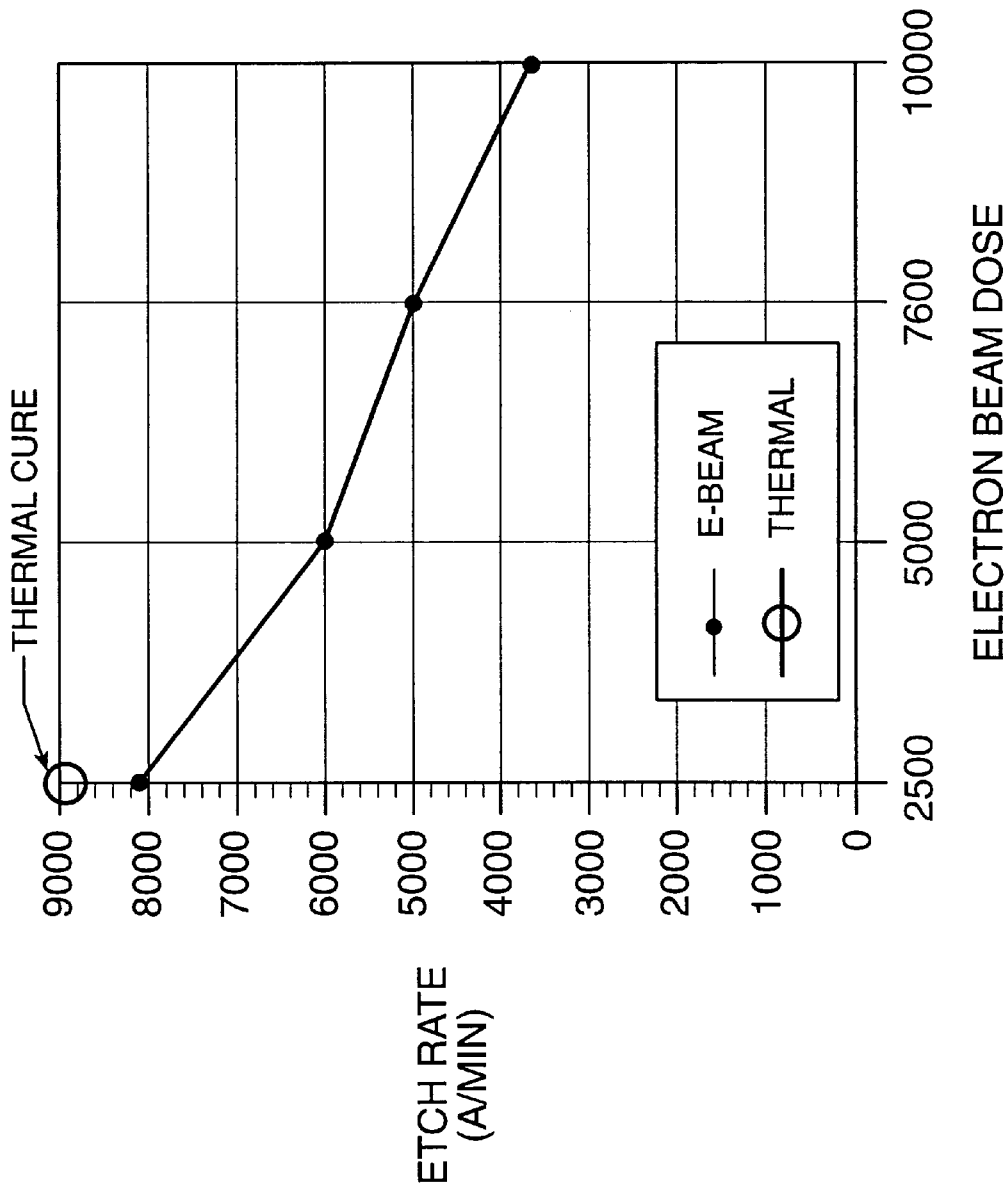
FIG. 9 is a graph of the dry etch rate of AlliedSignal's Accuglass 211 SOG, in Å/min. vs. dose of electron beam radiation in $\mu C/cm^2$.

After the brief heating, the electron beam-curable material on the substrate is treated with the selected dose of electron beam radiation necessary to achieve the desired etch rate. As used herein, the term "selected dose of electron beam radiation" or "controlled dose of electron beam radiation" refers to that dose of electron beam radiation which has been preselected based upon its ability to result in a particular etch rate of the electron beam-curable material upon which it is being used. The electron beam curing is carried out utilizing instruments and procedures wellknown to one of ordinary skill in the art. No electron beam curing typically results in an uncontrolled etch rate of more than about 1000 Å/second, whereas full electron beam curing, typically in the range of about 2000 to about 10,000 $\mu$C/cm2, results in an etch rate which approaches zero for practical purposes. For example, Accuglass 211 SOG, supplied by AlliedSignal, as shown in Electron Vision Technical Bulletin, Jun. 16, 1994 entitled "Electron Beam Processing of AlliedSignal Accuglass 211 SOG", has a wet etch rate vs. dose as shown in FIG. 8. The samples are described as being etched in 50:1 buffered oxide etch. As shown in the graph in FIG. 8, a dose of electron beam radiation of approximately 2500 to approximately 10,000 $\mu$C/cm$^2$ result in a etch rate which is approximately 500 Å/min., whereas no electron beam curing results in an etch rate of approximately 3000 Å/min. In between these extremes, a dose of electron beam radiation of approximately 500 $\mu$C/cm$^2$ results in an etch rate of approximately 2500 Å/min, a dose of approximately 1000 $\mu$C/cm$^2$ results in an etch rate of approximately 2000 Å/min, a dose of approximately 1500 $\mu$C/cm$^2$ results in an etch rate of approximately 1500 Å/min, and an etch rate of approximately 2000 $\mu$C/cm$^2$ results in an etch rate of approximately 1000 Å/min. When this same material is subjected to a dry etch, the results are shown in FIG. 9. The samples are described as being etched in a Matrix 303 Etcher with the following process conditions: 1.2 Torr, 35 sccm, NF3, 56 sccm He, 325 Watts, 100° C. As shown in the graph in FIG. 9, a dose of electron beam radiation of approximately 10,000 $\mu$C/cm$^2$ result in an etch rate of approximately 3600 Å/min., a dose of approximately 7600 $\mu$C/cm$^2$ results in an etch rate of approximately 5000 Å/min., a dose of approximately 5000 $\mu$C/cm$^2$ results in an etch rate of approximately 6000 Å/min., and an etch rate of approximately 2500 $\mu$C/cm$^2$ results in an etch rate of approximately 8000 Å/min. In addition, photoresist OLIN-897, with no e-beam cure, demonstrated a total film loss upon 5 minute dip in a 30° C., 2.25% TMAH by weight bath after a 93° C., 90 second prebake, of 12600 Å, giving an etch rate of 2520 Å/min. With an electron beam dose of 1000 $\mu$C/cm$^2$, total film loss was 600 Å, giving an etch rate of 120 Å/min. With an electron dose of 2000 $\mu$C/cm$^2$, there was no appreciable film loss and the etch rate approaches zero.

Next, the substrate coated with the electron beam-treated material is subjected to typical wet or dry CMP processes to remove the cured etch mask material and, if desired, plane the substrate surface. Wet CMP processes are those processes which utilize liquid reactants and include any of the following techniques: 1) use of a slurry having a chemically active component and an abrasive element which is used in conjunction with a polishing pad or 2) use of a slurry having a chemically active component and an abrasive element carried within the polishing pad. Dry CMP processes are those processes which utilize reactive gases energized by a plasma field, i.e., a field of high energy gas made up of ionized particles and include any of the typical plasma or reactive ion etching procedures.

According to the present invention, when the CMP processes are used to not only remove an etch mask material, but also render a substrate surface planar, the term "planar" means a flat surface, typically one that does not vary over its surface by more than 1000–2500 Å, and preferably, not more than about the 1500 Å range.

As one of ordinary skill in the art would realize, the choice of CMP processes and parameters is dependent upon the particular etch masking material. For example, if the etch mask material is an organic material, a wet CMP process using a bath slurry which is selective to organic materials, such as a cerium dioxide slurry may be used.

What is claimed is:

1. A method of removing an electron beam-treated material from a substrate comprising:
    a) subjecting an electron beam-curable material to a controlled dose of electron beam radiation; and
    b) removing at least a portion of the electron beam-treated material by means of chemical-mechanical polishing, wherein the dose of electron beam radiation is selected such that the electron beam-treated material is removed by the chemical-mechanical polishing at a controlled rate.

2. A method of claim 1 wherein the electron beam-curable material is a photoresist.

3. A method of claim 2 wherein the photoresist is a m-cresol Novolak formaldehyde.

4. A method of claim 1 wherein the substrate is a silicon wafer.

5. A method of removing an electron beam-treated photoresist from a silicon wafer comprising:
    a) subjecting the photoresist to a controlled dose of electron beam radiation; and
    b) removing at least a portion of the electron beam-treated photoresist by means of chemical-mechanical polishing, wherein the dose of electron beam radiation is selected such that the electron beam-treated photoresist is removed by the chemical-mechanical polishing at a controlled rate.

6. A method of claim 5 wherein the photoresist is a m-cresol Novolak formaldehyde.

7. A method of claim 5 wherein the chemical-mechanical polishing is wet chemical-mechanical polishing.

8. A method of claim 7 wherein the wet chemical phase of the wet mechanical polishing is a material which is selective to organic materials.

9. A method of claim 5 wherein the chemical-mechanical polishing is dry chemical-mechanical polishing.

10. A method of planing the surface of a substrate comprising:
    a) applying an electron beam curable material to the surface of the substrate;
    b) subjecting the material to a controlled dose of electron beam radiation; and
    c) removing at least a portion of the electron beam-treated material and those portions of the substrate surface as is required to plane the surface of the substrate, wherein said removal is by means of chemical-mechanical polishing, and
    wherein the dose of electron beam radiation is selected such that the electron beam-treated material is removed by the chemical-mechanical polishing at substantially the same rate as the rate of removal of the substrate by the chemical-mechanical polishing.

11. A method of claim 10 wherein the electron beam-curable material is a photoresist.

12. A method of claim 11 wherein the photoresist is a m-cresol Novolak formaldehyde.

13. A method of planing the surface of a silicon wafer comprising:
    a) applying an electron beam-curable material to the surface of the silicon wafer,
    b) subjecting the material to a controlled dose of electron beam radiation; and
    c) removing at least a portion of the electron beam-treated material and those portions of the silicon wafer surface as is required to plane the surface of the silicon wafer, wherein said removal is by means of chemical-mechanical polishing, and
    wherein the dose of electron beam radiation is selected such that the electron beam-treated material is removed by the chemical-mechanical polishing at substantially the same rate as the rate of removal of the silicon wafer surface by the chemical-mechanical polishing.

14. A method of planing the surface of a silicon wafer comprising:
    a) applying a photoresist to the surface of the silicon wafer;
    b) subjecting the photoresist to a controlled dose of electron beam radiation; and
    c) removing at least a portion of the electron beam-treated photoresist and those portions of the silicon wafer surface as is required to plane the surface of the silicon wafer, wherein said removal is by means of chemical-mechanical polishing, and
    wherein the dose of electron beam radiation is selected such that the electron beam-treated photoresist is removed by the chemical-mechanical polishing at substantially the same rate as the rate of removal of the silicon wafer surface by the chemical-mechanical polishing.

15. A method of planing the surface of a silicon wafer comprising:

a) applying a m-cresol Novolak formaldehyde to the surface of the silicon wafer;

b) subjecting the m-cresol Novolak formaldehyde to a controlled dose of electron beam radiation; and c) removing at least a portion of the electron beam-treated m-cresol Novolak formaldehyde and those portions of the silicon wafer surface as is required to plane the surface of the silicon wafer, wherein said removal is by means of chemical-mechanical polishing, and wherein the dose of electron beam radiation is selected such that the electron beam-treated m-cresol Novolak formaldehyde is removed by the chemical-mechanical polishing at substantially the same rate as the rate of removal of the silicon wafer surface by the chemical-mechanical polishing.

16. A method of forming a planar surface on a silicon wafer, but having regions of electron beam-treated material which are concave with respect to the plane of the silicon wafer surface comprising:

a) applying an electron beam-curable material to the surface of the silicon wafer;

b) subjecting the material to a controlled dose of electron beam radiation; and c) removing at least a portion of the electron beam-treated material and those portions of the silicon wafer surface as are required to form a planar surface on the silicon wafer having regions of electron beam-treated material which are concave with respect to the plane of the silicon wafer thereon, wherein said removal is by means of chemical-mechanical polishing, and wherein the dose of electron beam radiation is selected such that the electron beam-treated material is removed by the chemical-mechanical polishing at a faster rate than the rate of removal of the silicon wafer surface by the chemical-mechanical polishing.

17. A method of claim 16 wherein the electron beam-curable material is a photoresist.

18. A method of claim 17 wherein the photoresist is a m-cresol Novolak formaldehyde.

19. A method of forming a planar surface on a silicon wafer, but having regions of an electron beam-treated material which are convex with respect to the plane of the silicon wafer surface comprising:

a) applying an electron beam-curable material to the surface of the silicon wafer;

b) subjecting the material to a controlled dose of electron beam radiation; and c) removing at least a portion of the electron beam-treated material and those portions of the silicon wafer surface as are required to form a planar surface on the silicon wafer, but having regions of electron beam-treated material which are convex with respect to the plane of the silicon wafer surface, wherein said removal is by means of chemical-mechanical polishing, and wherein the dose of electron beam radiation is selected such that the electron beam-treated material is removed by the chemical-mechanical polishing at a slower rate than the rate of removal of the silicon wafer surface by the chemical-mechanical polishing.

20. A method of claim 19 wherein the electron beam-curable material is a photoresist.

21. A method of claim 20 wherein the photoresist is a m-cresol Novolak formaldehyde.

22. A method of planing the surface of a silicon wafer comprising:

a) applying a m-cresol Novolak formaldehyde to the surface of the silicon wafer;

b) subjecting the m-cresol Novolak formaldehyde to a controlled dose of electron beam radiation; and c) removing at least a portion of the electron beam-treated m-cresol Novolak formaldehyde and those portions of the silicon wafer surface as is required to plane the surface of the silicon wafer, wherein said removal is by means of wet chemical mechanical polishing, and wherein the dose of electron beam radiation is selected such that the electron beam-treated m-cresol Novolak formaldehyde is removed by the wet chemical mechanical polishing at substantially the same rate as the rate of removal of the silicon wafer surface by the chemical-mechanical polishing.

23. A method of claim 22 wherein the wet chemical phase of the wet chemical mechanical polishing is a material which is selective to organic materials.

24. A method of planing the surface of a silicon wafer comprising:

a) applying a m-cresol Novolak formaldehyde to the surface of the silicon wafer;

b) subjecting the m-cresol Novolak formaldehyde to a controlled dose of electron beam radiation; and c) removing at least a portion of the electron beam-treated m-cresol Novolak formaldehyde and those portions of the silicon wafer surface as is required to plane the surface of the silicon wafer, wherein said removal is by means of dry chemical mechanical polishing, and wherein the dose of electron beam radiation is selected such that the electron beam-treated m-cresol Novolak formaldehyde is removed by the dry chemical mechanical polishing at substantially the same rate as the rate of removal of the silicon wafer surface by the chemical-mechanical polishing.

25. A silicon wafer having a planar surface, but having regions of electron beam-treated material which are concave with respect to the plane of the silicon wafer surface prepared by a process comprising the steps of:

a) applying an electron beam-curable material to the surface of a silicon wafer, b) subjecting the material to a controlled dose of electron beam radiation; and c) removing at least a portion of the electron beam-treated material and those portions of the silicon wafer surface as are required to form a planar surface on the silicon wafer having regions of electron beam-treated material which are concave with respect to the plane of the silicon wafer thereon, wherein said removal is by means of chemical-mechanical polishing, and wherein the dose of electron beam radiation is selected such that the electron beam-treated material is removed by the chemical-mechanical polishing at a faster rate than the rate of removal of the silicon wafer surface by the chemical-mechanical polishing.

26. A silicon wafer according to claim 25 wherein the electron beam-curable material is a photoresist.

27. A silicon wafer according to claim 26 wherein the photoresist is a m-cresol Novolak formaldehyde.

28. A silicon wafer having a planar surface, but having regions of electron beam-treated material which are convex with respect to the plane of the silicon wafer surface prepared by a process comprising the steps of:

a) applying an electron beam-curable material to the surface of a silicon wafer;

b) subjecting the material to a controlled dose of electron beam radiation; and c) removing at least a portion of the electron beam-treated material and those portions of the silicon wafer surface as are required to form a planar surface on the silicon wafer having regions of electron beam-treated material which are convex with respect to the plane of the silicon wafer thereon, wherein said removal is by means of chemical-mechanical polishing, and wherein the dose of electron beam radiation is selected such that the electron beam-treated material is removed by the chemical-mechanical polishing at a slower rate than the rate of removal of the silicon wafer surface by the chemical-mechanical polishing.

29. A method of claim 28 wherein the electron beam-curable material is a photoresist.

30. A method of claim 29 wherein the photoresist is a m-cresol Novolak formaldehyde.

* * * * *